United States Patent
Pereira (10) Patent No.: US 7,463,042 B2
(45) Date of Patent: Dec. 9, 2008

(54) CONNECTOR PROBING SYSTEM

(75) Inventor: John C. Pereira, Park Ridge, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/171,059

(22) Filed: Jun. 30, 2005

(65) Prior Publication Data

US 2007/0001691 A1 Jan. 4, 2007

(51) Int. Cl.
*G01R 31/02* (2006.01)
(52) U.S. Cl. .................... 324/754; 324/538; 324/158.1
(58) Field of Classification Search ......... 324/754–765, 324/538, 715, 158.1; 439/482
See application file for complete search history.

(56) References Cited

U.S. PATENT DOCUMENTS

| | | | | |
|---|---|---|---|---|
| 4,115,736 | A * | 9/1978 | Tracy | 324/760 |
| 4,751,457 | A | 6/1988 | Veenendaal | |
| 4,774,462 | A | 9/1988 | Black | |
| 4,820,975 | A * | 4/1989 | Diggle | 324/758 |
| 4,970,461 | A * | 11/1990 | LePage | 324/752 |
| 5,072,185 | A | 12/1991 | Rockwell | |
| 5,122,070 | A | 6/1992 | Lebris et al. | |
| 5,467,023 | A * | 11/1995 | Takeyama | 324/754 |
| 5,744,966 | A * | 4/1998 | Sato | 324/538 |
| 5,777,480 | A * | 7/1998 | Hatagishi et al. | 324/538 |
| 5,963,027 | A | 10/1999 | Peters | |
| 6,002,263 | A | 12/1999 | Peters et al. | |
| 6,137,300 | A | 10/2000 | Hayashida | |
| 6,157,197 | A * | 12/2000 | Iwasaki | 324/538 |
| 6,208,375 | B1 * | 3/2001 | Kay et al. | 348/95 |
| 6,252,392 | B1 | 6/2001 | Peters | |
| 6,268,719 | B1 * | 7/2001 | Swart | 324/158.1 |
| 6,285,200 | B1 * | 9/2001 | Pace et al. | 324/753 |
| 6,307,389 | B1 * | 10/2001 | Buks et al. | 324/758 |
| 6,362,636 | B1 | 3/2002 | Peters et al. | |
| 6,377,066 | B1 * | 4/2002 | Bridges et al. | 324/765 |
| 6,396,296 | B1 * | 5/2002 | Tarter et al. | 324/765 |
| 6,480,004 | B1 | 11/2002 | Iwasaki | |
| 6,480,005 | B2 * | 11/2002 | Nagano et al. | 324/538 |
| 6,489,789 | B2 | 12/2002 | Peters et al. | |
| 6,639,415 | B2 | 10/2003 | Peters et al. | |
| 6,661,237 | B2 | 12/2003 | Teich | |
| 6,677,773 | B2 * | 1/2004 | Prokopp | 324/761 |
| 6,717,423 | B1 | 4/2004 | Thurairajaratnam et al. | |

(Continued)

*Primary Examiner*—Ha Tran T Nguyen
*Assistant Examiner*—Arleen M Vazquez
(74) *Attorney, Agent, or Firm*—Stetina Brunda Garred & Brucker (57) ABSTRACT

An improved probing system is provided for facilitating the making electrical connections to a variety of connectors. The system can be implemented with a plurality of probes capable of being independently translated and pivoted in a plurality of directions under computer control for contacting portions of an electrical connector under test. Probes of the system can be easily reconfigured to test a plurality of different connector types without requiring the use of custom harnesses. A connector having a plurality of contact portions can be received into a gripping mechanism of the probing system. An image of the connector can be captured by a camera of the system and processed by a computing device. Various probes can be positioned to contact the connector to facilitate the performance of tests on the connector, including the application of voltages and currents to the connector, as well as the detection of the same from the connector.

25 Claims, 5 Drawing Sheets

U.S. PATENT DOCUMENTS

| | | |
|---|---|---|
| 6,798,227 B1 | 9/2004 | Hwang |
| 6,842,260 B2 * | 1/2005 | Dietrich et al. ............. 356/614 |
| 7,015,711 B2 * | 3/2006 | Rothaug et al. ............. 324/758 |
| 7,026,832 B2 * | 4/2006 | Chaya et al. ................ 324/754 |
| 7,151,386 B2 * | 12/2006 | Kim ........................... 324/754 |
| 2003/0001599 A1 | 1/2003 | Craven et al. |
| 2003/0057959 A1 | 3/2003 | Teich |
| 2004/0012400 A1 | 1/2004 | Sauk et al. |

* cited by examiner

CONNECTOR PROBING SYSTEM

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Field of the Disclosure

The present disclosure relates generally to electronic test equipment, and more particularly to probing systems for making electrical connections to a variety of electrical connectors.

2. Description of the Related Art

As is well known to technicians, many electronic systems must be tested as a part of ongoing inspections, maintenance, and repair efforts. In this regard, electrical wiring, cables, and connectors are often tested for continuity, signal integrity, and/or other functionality. Such testing procedures can be especially important in the field of aviation where electronic equipment often provides a vital role in the proper functioning of aircraft systems.

Unfortunately, many of the presently-existing testing tools are inefficient, cumbersome, and generally difficult to use. One common problem faced by users of such tools is the diverse number of electrical connectors employed by modern electronic systems. Test equipment that is designed for use with one type of electrical connector is often incompatible with other types of connectors. As a result, users can be forced to maintain a large number of different testing systems in order to handle the various types of connectors they may encounter.

One approach to this problem has been the use of modular testing equipment. Such equipment can be configured and reconfigured for testing different types of connectors through the attachment of various custom connector-specific harnesses. However, such modular equipment can be unduly cumbersome to use. Typically, users are forced to manually attach, detach, and re-attach custom harnesses in the course of testing different types of connectors. This manual process can be exceedingly inconvenient and time-consuming for users of such equipment.

In addition, it can be extremely cumbersome for users to acquire the large number of custom modular harnesses that may be necessary for properly testing various electrical connectors. Moreover, the process of acquiring all of the harnesses that may be required to test a variety of connectors can be cost-prohibitive.

Accordingly, there exists a need for an improved probing system and associated methods that provide for increased ease of use and efficiency over prior art approaches.

BRIEF SUMMARY

The present disclosure, roughly described, provides improved methods and systems for making electrical connections to a variety of electrical connectors. A probing system can be implemented with a plurality of probes that can be independently translated and pivoted in a plurality of directions for contacting portions of an electrical connector under test. Probes of the system can be easily reconfigured to test a plurality of different connector types without requiring the use of custom modular harnesses.

In one embodiment, a probing system for making electrical connections to a variety of electrical connectors can be provided comprising a plurality of probes. Each of the probes can include a motorized portion for translating the probes between a plurality of positions. A gripping mechanism for receiving and securing an electrical connector in proximity to the probes can further be provided. At least one of the probes can be positioned to contact the connector after the motorized portion of the probe has translated the probe from a first position to a second position. A housing substantially enclosing the probes can be provided with an aperture in proximity to the gripping mechanism, thereby allowing the probe to contact the connector through the aperture while the probe is in the second position.

Each of the probes can comprise a motorized base, an elongate probe arm having a first end engaged with the base, and a probe tip for contacting an individual contact in the connector, the probe tip being engaged with a second end of the probe arm. The first end of the probe arm of each probe can be pivotally engaged with the base of the probe, allowing the probe arm to pivot in relation to the base. A computing device can also be provided for controlling the probes in response to software instructions.

In another embodiment, a method for making electrical connections to a variety of electrical connectors is provided. A connector having a plurality of contact portions can be received into a gripping mechanism of a probing system. The connector can be secured in a fixed position relative to the probing system by the gripping mechanism. An image of the connector can be captured and processed. At least one of a plurality of probes can translated to contact a first contact portion of the connector through operation of a motorized portion of the probe. While the probe contacts the first contact portion of the connector, one or more tests can be performed. Such tests can include the application of voltages and currents to the connector, as well as the detection of the same from the connector.

These as well as other embodiments contemplated by the present disclosure will be more fully set forth in the detailed description below and the figures submitted herewith.

DETAILED DESCRIPTION

Figure 1:
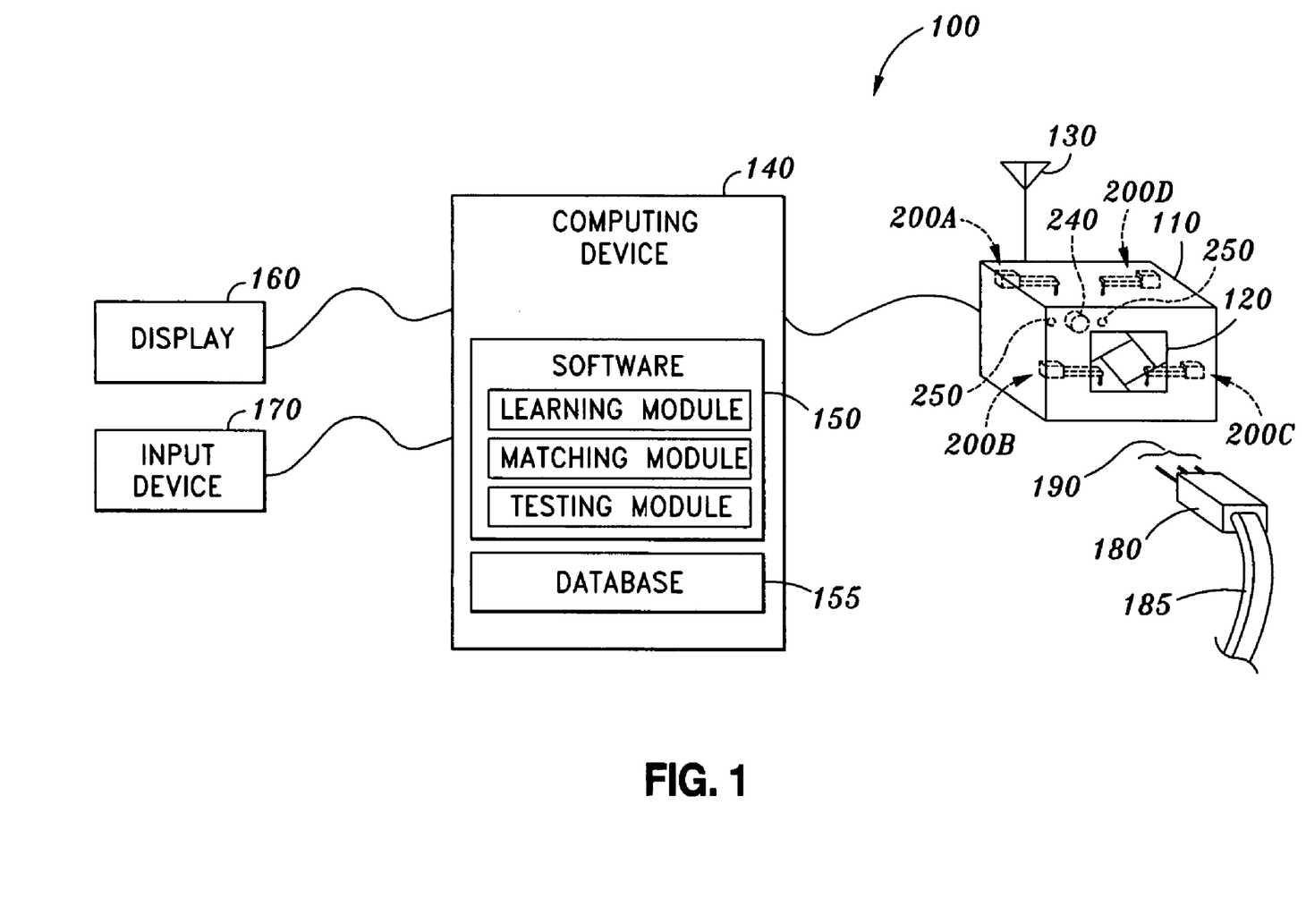
FIG. 1 is a block diagram of a probing system in accordance with an embodiment provided by the present disclosure.

FIG. 1 is a block diagram of a probing system 100 in accordance with an embodiment of the present disclosure. As illustrated, system 100 includes a plurality of probes 200A-D substantially enclosed by a housing 110. As further described herein, the probes 200A-D can be pivoted and translated in a plurality of directions in order to contact various portions 190 of an electrical connector 180 for performing tests on the connector 180. The probes 200A-D can be provided with appropriate stimulus and measurement circuitry for applying voltages, currents, and signals to the connector, and detecting the same from the connector 180. Such circuitry can allow the system 100 to perform continuity tests, signal integrity tests, tests for shorted pins, cable deterioration tests, and other tests as may be desired on connector 180.

Referring now to other components of the system 100, a gripping mechanism 120 can be provided in an aperture of the housing 110 for receiving an electrical connector 180 to be tested by the system 100. The electrical connector 180 can be secured by the gripping mechanism 120 and supported in a substantially orthogonal position relative to the housing 110 and in proximity to the probes 200A-D upon insertion of the connector 180 into the gripping mechanism 120. In one embodiment, gripping mechanism 120 can be implemented as a manually adjustable mechanical shutter that can be sized to grip a range of connector sizes.

Electrical connector 180 is one of any number of electrical connectors known in the art. Typically, connector 180 will be secured to the end of a cable 185 as illustrated in FIG. 1. The electrical connector 180 may include one or more contact portions 190 such as male and/or female conductive pins or indentations which may be contacted by the probes 200A-D during testing of the connector 180.

A computing device 140 can be provided in communication with the probes 200A-D, a camera 240, light sources 250, and/or other components disposed within the housing 110. Such components can be operated by computing device 140 in response to instructions provided by software 150 running on the computing device 140 and/or user input. It will be appreciated that computing device 140 can be implemented as any appropriate general purpose or specialized computer (s) known in the art.

An input device 170 in communication with computing device 140 can receive data input by a user for operating the system 100. It will be appreciated that the input device 170 can be any appropriate type of input device known in the art, including but not limited to a keyboard, mouse, touchpad, trackball, and/or other appropriate input devices.

System 100 can also be provided with a monitor/display 160 in communication with computing device 140 for displaying output of the system 100, such as images captured by camera 240 of the system 100 as further described herein. System 100 can further be provided with an antenna 130 for sending and receiving testing information with other probing systems as further described herein.

A database 155 can be provided on computing device 140 for maintaining information concerning various electrical connectors 180 that may be tested with system 100. The database 155 can be accessed by software 150 for obtaining information that identifies connectors 180 and associated contact portions 190 of the connectors that are to be tested by the system 100.

Software 150 running on the computing device 140 can be provided for instructing the computing device 140 for performing various processing steps as further described herein. Software 150 can be implemented as any appropriate software program(s), application(s), or component(s). A testing module portion of the software 150 can be provided for controlling the operation of probes 200A-D, camera 240, light sources 250, and/or other components of the system 100 for conducting tests on an inserted connector 180.

A learning module portion of the software 150 can be provided for identifying new connectors 180 and contact portions 190 thereof. The learning module can be configured to output images received from camera 240 to display 160.

Upon viewing the output, a user of the system 100 can operate input device 170 to select one of more portions of the output image corresponding to contact portions 190 of the connector 180. The user may also input identification numbers/letters for the contact portions 190 as well as a part number for the connector itself 180. In response, the learning module can store this information in database 155 where it may be accessed by software 150.

A matching module portion of the software 150 can be provided for comparing images of connector 180 received from camera 240 with information in database 155. By comparing the pin counts, pin markings, and/or other identifying characteristics of the connector 180 with the information in database 155, software 150 can identify various types of connectors 180 inserted into gripping mechanism 120. The matching module may also be configured to detect the orientation of the connector (for example, the location "pin 1" of the connector 180). Alternatively, the matching module may be configured to identify a list of possible connector types corresponding to the inserted connector 180. In response, the user may select the actual connector type from the list. In another embodiment, the user may input an identification of the connector 180 into system 100.

In certain applications, it can be advantageous for system 100 to be implemented as a low power, portable unit capable of performing tests and measurements at remote locations. For example, it may be desirable to have one or more components of the system 100 to "hang" from a connector/cable assembly that is installed in an aircraft or other remote location. In such applications, various components of system 100 can be implemented with low weight materials such as nylon in order to reduce weight and decrease the need for lubricating the probes 200A-D.

Figure 2:
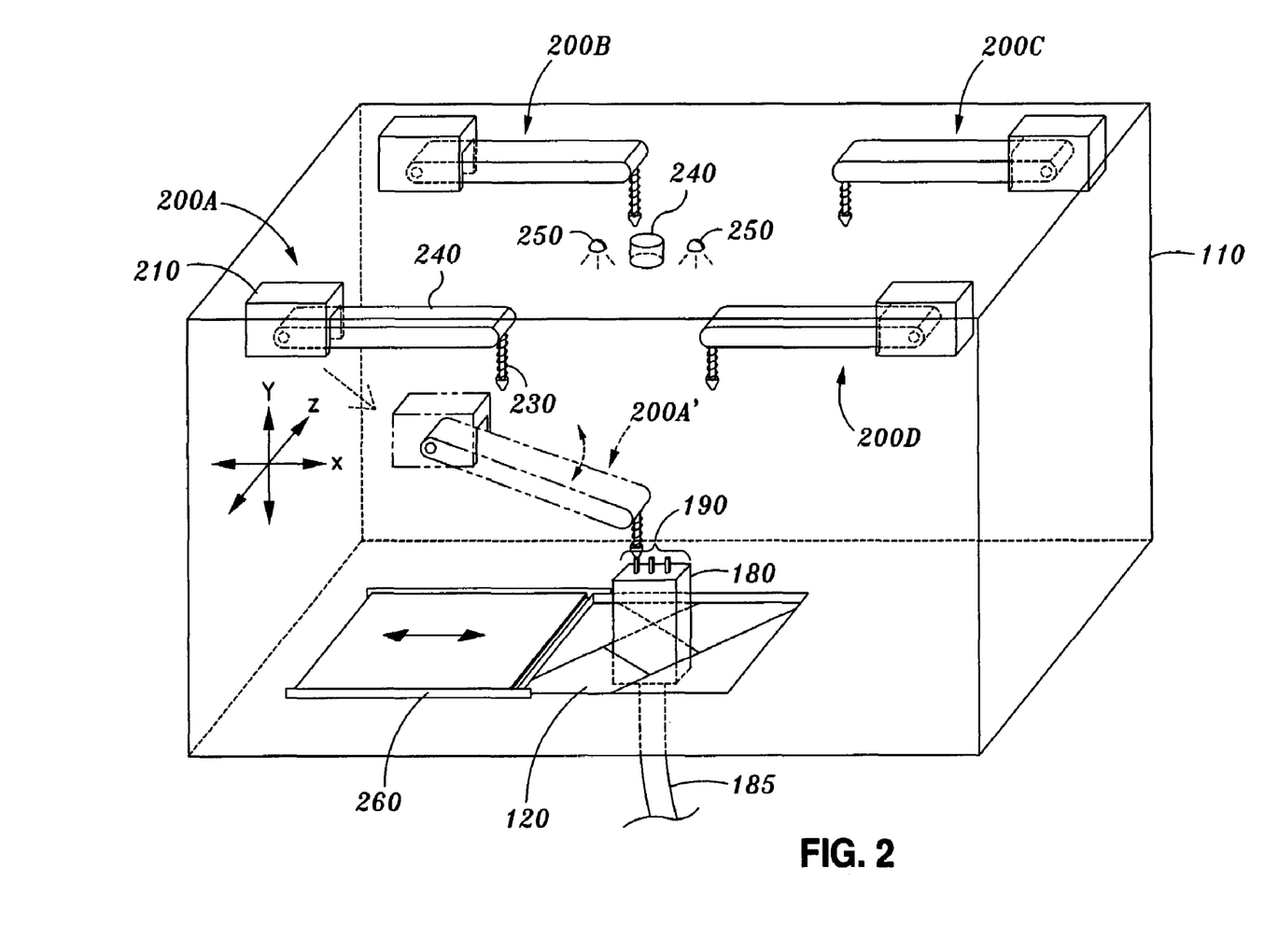
FIG. 2 is a cutaway perspective view of interior portions of the housing 110 of a probing system in accordance with an embodiment provided by the present disclosure.

FIG. 2 illustrates a cutaway perspective view of interior portions of the housing 110 of a probing system 100 in accordance with an embodiment of the present disclosure. As illustrated, connector 180 can be inserted into housing 110 and secured by gripping mechanism 120. An electrically-operated door 260 provided on an interior wall of housing 110 can be operated along the X-axis by computing device 150 for opening and closing the aperture formed by gripping mechanism 120. For example, when the probes 200A-D are not in use, the door 260 can be closed in order to protect the probes 200A-D and interior portions of housing 110 from outside debris, dirt, and grime.

As discussed, a plurality of probes 200A-D under the control of computing device 140 are provided in the interior portion of the housing 110. Although four probes 200A-D are provided in the illustrated embodiment, it will be appreciated that any number of probes can be utilized in accordance with the present disclosure. Each of the probes 200A-D can comprise a motorized base portion 210, an elongate probe arm 240 having a first end engaged with the base 210, and a probe tip 230 engaged with a second end of the probe arm 240. Each probe tip 230 can be utilized for contacting portions 190 of the connector 180. As illustrated, probe tips 230 can also be spring-loaded in order to securely contact relevant portions of the connector 180.

Each of the probes 200A-D can be independently translated in a plurality of directions through operation of each probe's respective motorized base 210. Such translation can be performed along a variety of different axes, such as along the X, Y, and/or Z axes identified in FIG. 2. It is contemplated that the movement of each motorized base can be facilitated through any appropriate technology known in the art, such as by tracks (not shown) disposed along one or more inside surfaces of housing 110.

In addition, each probe arm 240 of the probes can be pivotally engaged with the base 210 of the probe, allowing the probe arm 240 to pivot relative to the base 210. It is contemplated that the probe bases 210 and probe arms 240 can be implemented to support any desired minimum or maximum pivot angle. For example, in one embodiment, each probe base 210 and probe arm 240 can be implemented to allow probe arm 240 to pivot 180 degrees relative to probe base 210.

The motorized bases 210 as well as the pivotal engagement of the bases 210 with the probe arms 240 can be implemented using motor driver circuits having built-in current sensing. It will be appreciated that by sensing high motor current, the system 100 can detect if one or more of the probes 200A-B has hit a stop. Such a current sensing implementation can remove any need for including large numbers of limit switches within housing 110 for detecting such stops.

A positive contact circuit can also be provided with probes 200A-D for informing the software 150 of the system that a probe has made positive contact with a contact portion 190 (such as a pin) of the connector 180. In one embodiment, such a circuit can be implemented by providing a very low current, high voltage bias on the probe and then using a comparator to detect when this bias voltage has been "pulled" to another value due to contact with the connector 180. In such an embodiment, the comparator can be associated with a software interrupt that detects if a connection has been lost during a measurement/testing procedure.

It will be appreciated that as a result of the translation and pivoting of the probes 200A-D, the probe tips 230 can be placed in proximity to contact portions 190 of connector 180 for testing the connector 180. For example, FIG. 2 illustrates probe 200A as having been translated and pivoted from a first position (denoted by the label 200A) to a second position (denoted by the label 200A'). It will be appreciated that while the probe is in the second position, the probe tip 230 is capable of contacting portions 190 of connector 180 for performing testing thereon.

As further illustrated in FIG. 2, a camera 240 can be provided in a wall of housing 110 opposite the connector 180 for capturing and providing images of the probes 200 and connector 180 to computing device 140. Camera 240 can be implemented with an appropriate focal length and depth of field in order to capture clear images of connector 180, contact portions 190, and markings on the connector 180 itself. In various embodiments, camera 240 can be further implemented with zoom and/or variable focus features.

A plurality of light sources 250 such as white LEDs, high brightness red LEDs, and/or other light sources may be provided in proximity to camera 240. The light sources 250 can be directed toward the interior of the housing 110 for illuminating the probes 200A-D and connector 180.

Figure 3A:
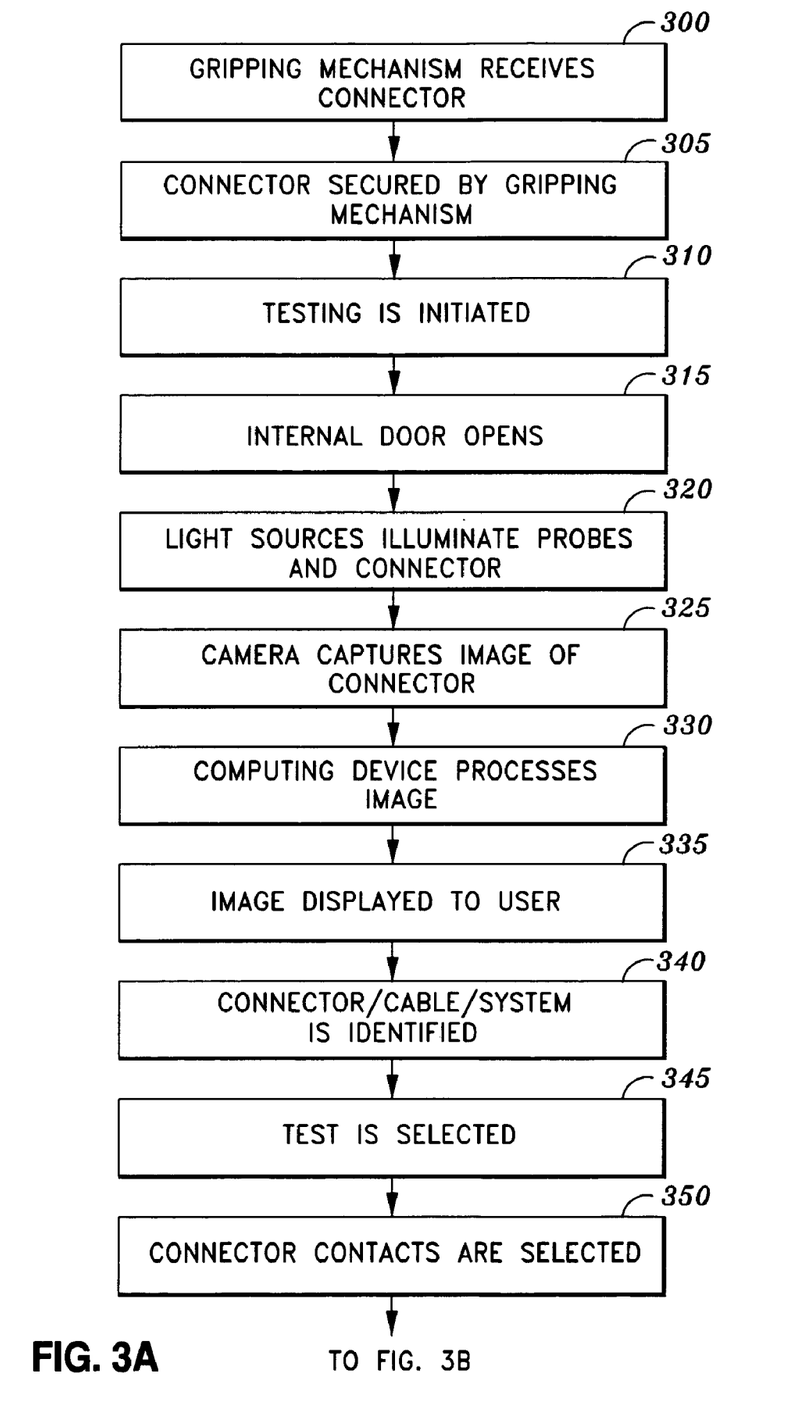
FIGS. 3A-B provide a flowchart describing a process for conducting tests using a probing system in accordance with an embodiment provided by the present disclosure.
Figure 3B:
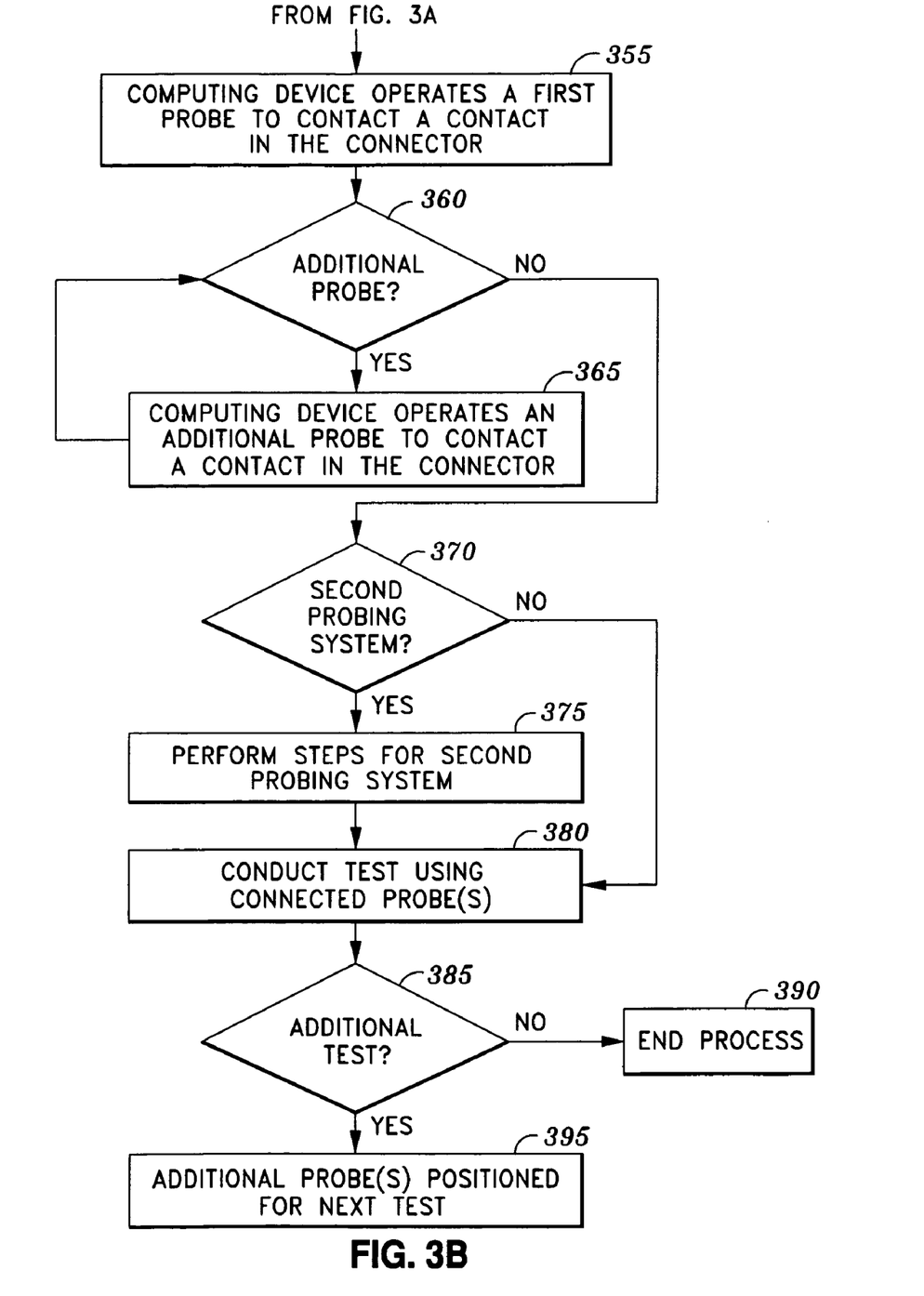

Turning now to an example of the operation of system 100, FIGS. 3A-B illustrate a flowchart describing a process for conducting tests using a probing system 100 in accordance with an embodiment of the present disclosure.

In order to prepare the system 100 for testing, gripping mechanism 120 initially receives the connector 180 to be tested (step 300) where it is secured for testing (step 305). Typically these steps will be facilitated by a user manually inserting the connector 180 into an aperture formed by the gripping mechanism and tightening the gripping mechanism to secure the connector 180 for testing. However, it is also contemplated that machine-implemented techniques for inserting and/or securing the connector 180 may alternatively be employed.

After the connector 180 is readied for testing through the operation of steps 300 and 305, testing can then be initiated by the user (step 310). Typically, this can be performed by the user manipulating input device 170 to cause the testing module of software 150 to begin instructing computing device 140 to control various components of system 100 as described in the following steps of FIGS. 3A-B.

In step 315, internal door 260 opens, revealing the interior of the housing 110 to connector 180 and allowing portions 190 of connector 180 to be exposed to probes 200A-D, camera 240, and light sources 250.

While the connector 180 is inserted, light sources 250 illuminate the probes 200A-D and the connector 180 (step 320). Camera 240 then captures an image of the connector 180 which is passed from the camera 240 to computing device 140 (step 325).

Upon receiving the captured image, the computing device 140 processes the image in accordance with instructions of software 150 (step 325). Such processing can include, for example, processing by the learning module and/or matching module of software 150 as previously described herein. As a result, the captured image can be displayed to a user of the system 100 on display 160 (step 335).

The connector 180 is then identified (step 340) by the matching module of software 150 and/or the user of the system 100. For example, a user of the system viewing the captured image of the connector on the display 160 may enter information through input device 170 identifying the connector 180 to the system 100. In another embodiment, the identification in step 340 can be performed exclusively by the matching module of software 150. For example, the software 150 could compare the captured image to connector information maintained in database 155 to obtain information identifying the connector 180.

Also in step 340, the system 100 can identify what type of cable and/or electrical system the connector 180 is a part of. In one embodiment, software 150 may instruct probes 200A-D to perform passive measurements in order to differentiate between different connector applications. For example, if the same type of connector is used for different functions in an electrical system, then probing for voltages on certain contact portions 190 may provide enough information to accurately identify what function is performed by a particular connector 180. It is contemplated that software 150 can be implemented with artificial intelligence technology for facilitating such functionality. Alternatively, a user of the system 100 could input an identification of the cable/electrical system applicable to the connector 180 into system 100.

After the connector, cable, and electrical system have been identified in step 340, one or more appropriate tests to be performed on the connector 180 may be selected (step 345). It is contemplated that a variety of testing procedures may be selected including, but not limited to tests for continuity, signal integrity, and others. Selection step 345 may be performed by a user entering information through input device 170 to select one or more testing procedures and/or by software 150 making such selection based on testing procedure information regarding the connector 180 available from database 155.

One or more contact portions 190 of the connector 180 can then be selected (step 350) for testing in accordance with the testing procedure selected in step 345. Similar to the embodiments discussed above in relation to steps 340 and 345, it is contemplated that the contact portions 190 can be selected by a user entering information through input device 170 identifying the contact portions 190 and/or the matching module of software 150 making such selection based on information regarding the connector 180 available from database 155.

In response to the selection made in step 345, the computing device 140 then operates a first one of the probes 200A-D to contact the connector 180 (step 355) in accordance with the selected testing procedure. If an additional probe is necessary to perform the selected testing procedure (step 360), then the computing device 140 operates an additional probe to contact the connector 180 (step 365). Steps 360 and 365 can be repeated until a sufficient number of the probes 200A-D have been placed in contact with connector 180 in order to perform the selected testing procedure. Thereafter, the process of FIG. 3B continues to step 370.

Figure 4:
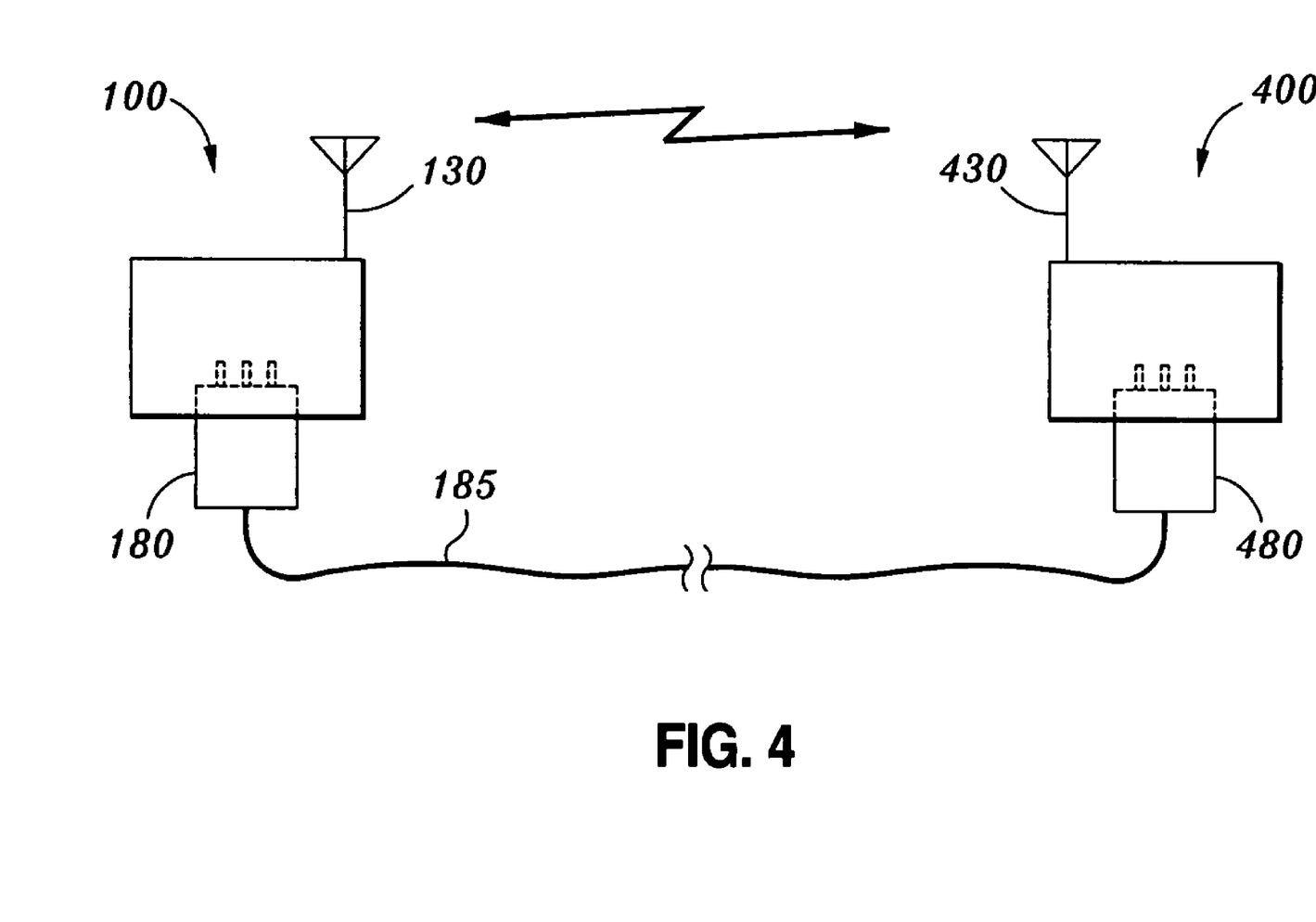
FIG. 4 is a block diagram of two probing systems in wireless communication with each other in accordance with an embodiment provided by the present disclosure.

In another aspect of the present disclosure, a second probing system can be utilized for testing a second end of cable 185 having a second connector 480. Turning to FIG. 4, simplified block diagrams of the first probing system 100 and a second probing system 400 are provided. As illustrated, the two probing systems 100 and 400 can be implemented with antennas 130 and 430, respectively, for sending and receiving wireless communications with each other. It will be appreciated that such wireless communication can be implemented in accordance with any suitable wireless technology such as IEEE 802.11g and/or other wireless technologies.

Referring again to FIGS. 3A-B, it will be appreciated that if a second probing system 400 is to be used in addition to the first probing system 100 for the selected testing procedure (step 370), then one or more of steps 300 through 365 described above in relation to system 100 can also be performed in relation to system 400 (step 375). For example, upon insertion of second connector 480 into the second probing system 400, one or more probes of the system 400 can be operated by a computing device of the system 400 to contact one or more portions of the second connector 480.

After all probes for the first probing system 100 and second probing system 400 (if necessary) have been translated and pivoted into position for contacting relevant portions of connectors 180 and 480, then computing device 140 is instructed by the testing module of software 150 to perform the selected test and measurements incident thereto on connector 180 and/or connector 480 (step 380). As discussed, such tests can include, but need not be limited to tests for: continuity, signal integrity, shorted pins, cable deterioration, and others as may be desired.

If an additional test is desired (step 385), then one or more additional probes can be positioned for the test (step 395) and appropriate steps of FIGS. 3A-3B can be repeated for performing the test. If no additional tests are to be performed, then the process ends (step 390).

In embodiments employing a plurality of probes, it is contemplated that system 100 can be configured to translate and/or pivot additional probes during testing step 380 in preparation for the next desired test to be performed by the system 100. As a result, the time required for positioning probes between successive tests can be substantially reduced over prior art approaches.

In embodiments employing both system 100 and system 400, tests can be performed on both connectors 180 and 480 to test aspects of the connectors and/or cable 185. For example, in one embodiment, a unique pulse train can be provided by probes of system 100 that are transmitted through connector 180, cable 185, and connector 480. The pulse train can also be transmitted from antenna 130 of system 100 to antenna 430 of system 400. By comparing the signals received through the probes of system 400 with the signals received through antenna 430, system 400 can determine whether a proper pulse signature (or other appropriate signal) has been properly transmitted by connector 180, cable 185, and connector 480. System 400 can also be configured to detect signals on other contact portions of connector 480 to measure cross-talk or other transmission artifacts received through connector 480.

In view of the present disclosure, it will be appreciated that a probing system 100 in accordance with the various features described herein provides significant advantages over prior art testing systems. Probes 200A-D can be easily reconfigured to test any desired type of connector 180 referenced in the database 155 of the system 100. Such reconfiguration can be performed without the manual application of custom harnesses adapted to fit various specific connectors. In addition, the system 100 can be configured to identify and test an ever-increasing variety of connector types through the operation of the learning module of software 150 and database 155. Moreover, the software 150 of system 100 can be implemented to automate various steps including the identification and probing of a connector, thereby reducing the number of steps performed by a user of the system 100 and making the system 100 less cumbersome to use in comparison to prior art systems.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be dissected into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can stored on one or more computer readable mediums. It is also contemplated that software identified herein can be implemented using one or more general purpose or specific purpose computers and/or computer systems, networked and/or otherwise.

Where applicable, the ordering of various steps described herein can be changed, combined into composite steps, and/or dissected into sub-steps to provide the functionality described herein.

The foregoing disclosure is not intended to limit the present disclosure to the precise forms or particular fields of use disclosed. It is contemplated that various alternate embodiments and/or modifications to the present disclosure, whether explicitly described or implied herein, are possible in light of the disclosure.

What is claimed is:

1. A probing system for making electrical connections to a variety of electrical connectors, the system comprising:

a frame;

a plurality of probes, each of the probes comprising a base portion for translating the respective probe between a plurality of positions, each of the probes having an elongate probe arm defining opposing first and second end portions, the first end portion being pivotally engaged with the respective base portion, the second end portion being engaged with a probe tip, the probe tip being engageable with a respective one of the variety of electrical connectors, at least one of the probes being engageable with the respective one of the variety of electrical connectors after the base portion of the at least one of the probes has translated from a first position to a second position; and a gripping mechanism connected to the frame, the gripping mechanism being translatable to receive and secure the respective one of the variety of electrical connectors in proximity to the plurality of probes, the gripping mechanism being translatable between open and closed positions relative to the frame, the gripping mechanism being engageable with the respective one of the variety of electrical connectors when the gripping mechanism is in the closed position, the gripping mechanism being disengageable from the respective one of the variety of electrical connectors when the gripping mechanism is in the open position, the gripping mechanism being translatable in response to the size and shape of the respective one of the variety of electrical connectors so as to accommodate connectors defining different sizes and shapes within the gripping mechanism independent of any modification of the gripping mechanism.

2. The probing system of claim 1, a second one of the probes capable of contacting a contact in the respective one of the variety of electrical connectors after the base portion of the second probe has translated the second probe from a third position to a fourth position.

3. The probing system of claim 1, the base portion of each probe comprises a motorized portion of the probe.

4. The probing system of claim 3, the motorized portion of each probe comprises the pivotal engagement of the base and the probe arm of the probe.

5. The probing system of claim 1, further comprising: a camera directed toward the aperture of the housing for capturing images of the probes and the connector.

6. The probing system of claim 5, further comprising: a computing device in communication with the camera and the probes, the computing device is configured to receive the captured image from the camera and regulate operation of the plurality of probes.

7. The probing system of claim 6, the computing device configured to send and receive signals in communication with the probes for testing the connector.

8. The probing system of claim 7, further comprising: a light source directed toward the aperture of the housing for illuminating the probes and the connector.

9. The probing system of claim 6 wherein the second position of the probe being vertically spaced from the first position of the probe by a distance computed by the computing device in response to information received from the camera.

10. The probing system of claim 9 wherein the base portion of the probe is vertically translated from the first position to the second position in response to the vertical distance calculated by the computing device.

11. The probing system of claim 6 wherein the computing device further comprises a learning module for determining the connector configuration, the learning module identifying the connector contact portions in response to receiving the captured image from the camera, the learning module calculating the distances between the connector contact portions.

12. The probing system of claim 1, wherein the gripping mechanism is a mechanically adjustable aperture.

13. The probing system of claim 1, further comprising: a door in proximity to the gripping mechanism for selectively blocking access to an interior portion of the frame.

14. The probing system of claim 1 wherein the connector to be secured by the gripping mechanism is a plug.

15. The probing system of claim 1, further comprising a plurality of sets of translation instructions, a set of translation instructions being selected in response to recognition of the connector.

16. The probing system of claim 1, wherein the base portion of the probe is configured to be vertically translatable relative to the respective one of the variety of electrical connectors.

17. The probing system of claim 1 wherein the gripping mechanism is configured to circumferentially engage with the respective one of the variety of electrical connectors when the gripping mechanism is in the closed position.

18. The probing system of claim 1 wherein the translation of the probes is regulated in response to optical recognition of the connector and implementation of connector specific translation instructions.

19. The probing system of claim 1 wherein movement of the gripping mechanism is variable in response to the size of the connectors.

20. The probing system of claim 1 wherein the gripping mechanism is radially translatable.

21. A method for making electrical connections to a variety of connectors, the method comprising:
providing a probing system comprising:
a plurality of probes, each of the probes comprising a motorized portion for translating the probes between a plurality of positions; and
a gripping mechanism;
moving the gripping mechanism from an open position to a closed position to secure a respective one of the variety of connectors having a connector configuration in a fixed position relative to the probing system, the gripping perimeter being moveable in response to the size and shape of the respective one of the variety of electrical connectors so as to accommodate different connectors defining different sizes and shapes within the gripping mechanism independent of any modification of the gripping mechanism;
detecting the connector configuration using a camera for capturing an image of the connector;
identifying the respective one of the variety of connectors by comparing the image of the connector received from the camera to information contained in a computing device database;
calculating a distance between the plurality of positions to effect abutting contact of the probes to the respective one of the variety of connectors;
translating the probes in response to the distance calculated between the plurality of positions; and
selecting one or more testing procedures based on the identification of the respective one of the variety of connectors.

22. The method of claim 21, the detecting and translating steps are performed by a computing device in communication with a camera and the probes.

23. The method of claim 21 wherein the step of moving the gripping mechanism is variable in response to the size of the connector.

24. The method of claim 14 wherein the fixed position of the respective one of the variety of connectors is variable.

25. The method of claim 21 wherein the steps of detecting, identifying, calculating, translating and selecting are adaptive in response to the position of the respective one of the variety of connectors.

* * * * *